United States Patent [19]

Ashelin et al.

[11] Patent Number: 5,184,284
[45] Date of Patent: Feb. 2, 1993

[54] METHOD AND APPARATUS FOR IMPLEMENTING ENGINEERING CHANGES FOR INTEGRATED CIRCUIT MODULE

[75] Inventors: Brian T. Ashelin, Kasson; Mark A. Bergquist; Dennis E. Noltee, Sr., both of Rochester, all of Minn.

[73] Assignee: International Business Machines Corporation, Armonk, N.Y.

[21] Appl. No.: 754,137

[22] Filed: Sep. 3, 1991

[51] Int. Cl.⁵ .................. H05K 1/14; H01L 39/06; H01R 9/09

[52] U.S. Cl. .................. 361/400; 174/254; 174/260; 174/261; 361/396; 361/395; 361/398; 361/404; 361/405; 361/406; 361/408; 361/409; 361/417; 439/83; 257/724

[58] Field of Search ............... 174/254, 255, 260, 261; 357/68, 74, 75, 80; 361/392, 393, 395, 397, 398, 400, 409, 414; 439/83

[56] References Cited

U.S. PATENT DOCUMENTS

| | | | |
|---|---|---|---|
| 3,984,860 | 10/1976 | Logue | 357/75 |
| 4,254,445 | 3/1981 | Ho | 361/392 |
| 4,339,628 | 7/1982 | Marcantonio et al. | 361/412 |
| 4,489,364 | 12/1984 | Chance et al. | 361/395 |
| 4,514,784 | 4/1985 | Williams et al. | 361/413 |
| 4,567,643 | 2/1986 | Droguet et al. | 357/80 |
| 4,652,974 | 3/1987 | Ryan | 361/395 |
| 4,706,165 | 11/1987 | Takenaka et al. | 361/403 |
| 4,721,995 | 1/1988 | Tanizawa | 357/80 |
| 4,731,704 | 3/1988 | Lochner | 361/400 |
| 4,733,461 | 3/1988 | Nakano | 361/412 |
| 4,742,431 | 5/1988 | Igarashi | 361/398 |
| 4,763,188 | 8/1988 | Johnson | 357/74 |
| 4,803,595 | 2/1989 | Kraus et al. | 361/412 |

FOREIGN PATENT DOCUMENTS

| | | | |
|---|---|---|---|
| 1511560 | 5/1978 | Fed. Rep. of Germany | 174/261 |
| 0086735 | 5/1983 | Japan | 357/69 |

OTHER PUBLICATIONS

IBM Technical disclosure Bulletin, "Silicon, Elevated, Wireless Module Method for Making Eng. Changes" vol. 31 No. 10 Mar. 1989.
IBM Technical Disclosure Bulletin "Salvaging Method for Defective Chips" vol. 34 No. 3 Aug. 1991.
IBM Disclosure Bulletin "Replacement Pads for SMT Components on Printed Circuit Boards" vol. 33 No. 3A Aug. 1990.

Primary Examiner—Leo P. Picard
Assistant Examiner—D. Sparks
Attorney, Agent, or Firm—Homer L. Knearl; Richard E. Billion

[57] ABSTRACT

Engineering changes (EC) for an integrated-circuit (IC) module or circuits connected to an IC module sometimes require the addition of discrete electrical components or circuit chips. Such engineering changes are implemented herein on a small printed circuit card or board that may be physically attached to the top of the IC module. The EC pads on the printed circuit EC card are juxtaposed with the IC module input/output (I/O) pins that require the engineering change. A short fly wire is then soldered between each juxtaposed EC pad and the I/O pin to make the electrical connection between the EC card and the module. In this way, no additional surface area is consumed on the printed circuit board on which the module is mounted.

13 Claims, 2 Drawing Sheets

METHOD AND APPARATUS FOR IMPLEMENTING ENGINEERING CHANGES FOR INTEGRATED CIRCUIT MODULE

BACKGROUND OF THE INVENTION

1. Field of the Invention

This invention is directed to a method or apparatus for making engineering changes to circuit modules. While the invention can be used to change circuit connections, the invention is particularly directed to adding discrete circuit elements or devices to circuit modules and thereby changing or adding to the electrical functions performed by the circuit module.

After multi-chip circuit carrier modules are in production, the time required to redesign and put in production a new version of the module is weeks or even months. Typically design faults in a module are corrected by adding and/or deleting electrical connections between chips on the carrier substrate of the module or electrical connections on the printed circuit board on which the module is mounted. However, the design itself may change such that new functions or enhancements of functions are added. Often in this event, discrete circuit components or chips must be added to the module In high density circuit packaging, the multi-chip carrier modules and the printed circuit boards or cards on which they are mounted are designed for optimum use of the surface area (or real estate) of the card. To add additional discrete circuit elements to make an engineering change to a module on the card may not be possible simply because there is not sufficient remaining surface area on the card.

2. Description of Prior Art

There are numerous examples in the art of printed circuit cards and integrated circuit modules wherein engineering changes are accomplished with wiring changes or interconnection line changes. In some cases the interconnection changes are accomplished with jumper wires or fly wires. In others the interconnection lines are changed by attaching an auxiliary printed circuit board or card. In yet other inventions, the wiring changes ar accomplished in multilayer substrates where the new interconnection lines may be buried; i.e. in an internal layer in a multilayer substrate.

All of the above examples use new real estate or surface area on the card if they add additional electrical components. One such example is U.S. Pat. No. 4,731,704 issued to A. Lochner. In the Lochner patent additional components are attached to the main or original printed circuit board. New electrical connections for the added components are provided by a new printed circuit foil which is attached to component pins protruding through the original printed circuit board. While Lochner teaches a technique for adding functional component engineering changes to a module, the invention presumes there is surface area available on the original board for the addition of new components.

SUMMARY OF THE INVENTION

It is an object of this invention to implement engineering changes to integrated circuit module and/or circuits, which are external to the module but connected to the I/O pins of the module, and to accomplish this within the printed circuit surface area used by the module on the card.

It is a further object of this invention to accomplish engineering changes for integrated circuit modules in situations, where the changes require new circuit components, and to do this without consuming additional surface area on the printed circuit board carrying the integrated circuit module.

The above objects and other features and objects of this invention, which will be apparent from the description of the preferred embodiments, are accomplished by implementing the engineering changes (EC) for the integrated circuit (IC) module on an EC printed circuit card, mounting this card on top of the IC module and attaching the I/O of the EC card to the I/O of the IC module. The resulting structure consumes no additional real estate or surface area on the printed circuit board carrying the IC module.

The engineering change on the EC card usually contains added electrical circuit elements, i.e. discrete components or chips. Such circuit elements can be mounted on one or both sides of the EC card. The EC card may be rigid or flexible and is positioned to overlay the IC module for which the engineering changes are being made.

For durability, the EC card is preferably attached to the IC module. This is accomplished by an adhesive layer between the underside of the EC card and the top of the IC module. The adhesive should be non-conductive if the IC module packaging is conductive. If the EC card has elements on both sides of the card, the card could be bonded to the top of the module with a non-conductive foam.

Electrical connection between the I/O of the EC card and the I/O of the IC module is preferably by fly wires from pads on the card to pins on the module. Each EC pad on the card is positioned so that it is adjacent the I/O pin of the module's integrated circuit being corrected or modified the EC circuit connected to that pad.

DESCRIPTION OF THE PREFERRED EMBODIMENTS

Figure 1:
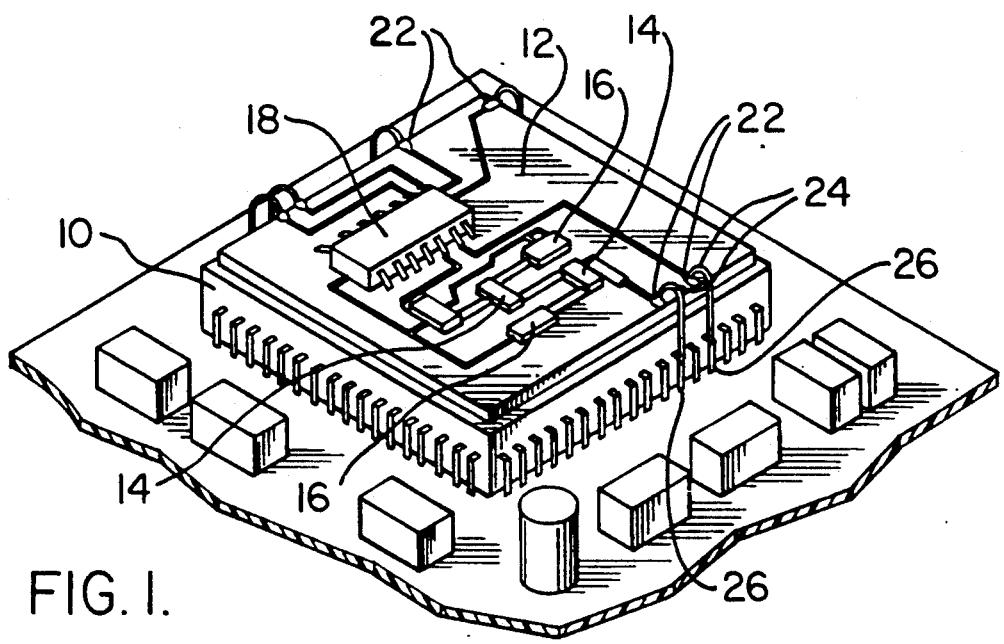
FIG. 1 shows a preferred embodiment of the invention with an EC printed circuit card mounted on the module being changed.
Figure 2:
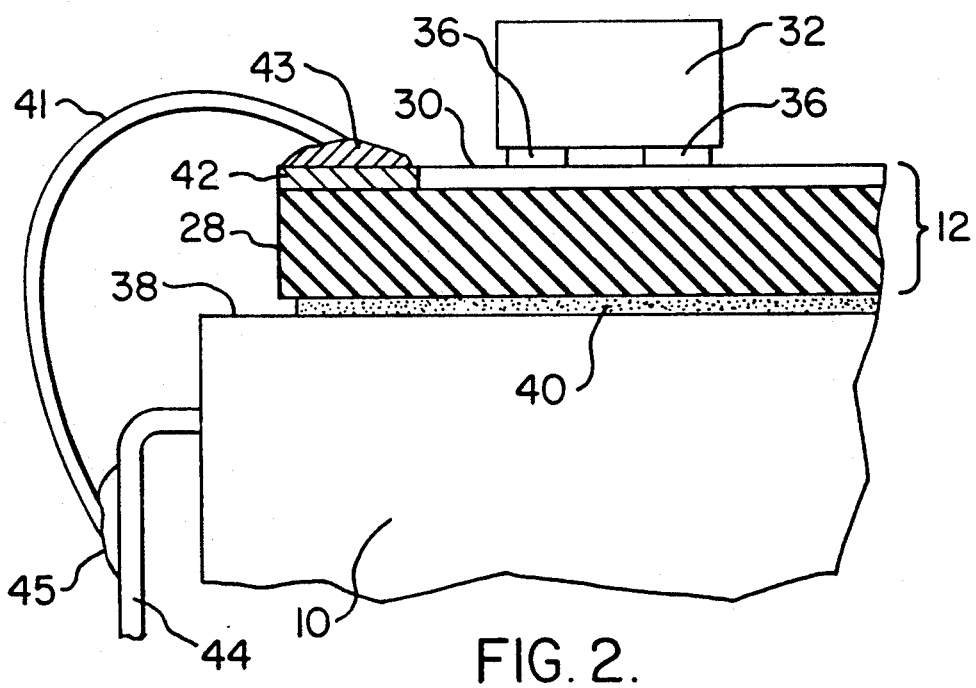
FIG. 2 shows a portion of the EC card in FIG. 1 in sectional side view as mounted on top of the module with a fly wire connecting a pad on the EC card with a module I/O pin. The engineering change circuit elements are all mounted on one side of the EC card.

The preferred embodiment of the invention is shown in FIGS. 1 and 2. Integrated circuit module 10 requires an engineering change. After the change has been designed, the circuit pattern is printed by etching depositing or both on a printed circuit card or carrier. In the present embodiment a copper layer was etched to make the printed circuit pattern. The carrier is preferably smaller than the largest surface of the integrated circuit module being modified. Also the carrier is preferably a card or board but could also be a flexible carrier such as KAPTON tape available from 3M. Discrete circuit components or chips required by the engineering change are then mounted on the carrier and connected by the printed circuit pattern.

The circuit card or carrier with its engineering changes is than layed on top of the IC module 10. The size of the card is such that it fits within the lateral boundaries of the IC module 10. Conductive wires are attached between the change circuit input/output pads and the input/output pins of the module circuit requiring the engineering change.

In FIG. 1, printed circuit card 12 contains the engineering change and is positioned on top of module 10. The engineering change may be simply a different connective path between module I/O pins. More significantly the engineering change illustrated in FIG. 1 requires active and passive circuit elements as well as an additional logic circuit chip.

The particular engineering change is not a part of the invention. The change illustrated in FIG. 1 happens to be a change to write current control turn-off in a hard disk drive. The change to this function in the integrated circuit module is accomplished by the circuit illustrated on the EC card 12. The change required active circuit elements such as transistors 14, passive circuit elements such as resistors 16 and a logic chip 18. In effect, a engineering change with additional circuit elements can be made without using any additional real estate on the main circuit board 20. Without the EC card all of these functional circuit elements would have to have been mounted on the main circuit board 20.

The additional circuit elements making up the EC are interconnected by connection lines on the surface of the EC card 12. The I/O terminals for the EC card are EC pads 22. Soldered to these pads are short connecting wires 24 that make electrical connection with module I/O pins 26 immediately below the EC pad. In other words the EC card circuit is laid out so that the EC pads on the card are immediately adjacent to module I/O pin which they are to be connected with. The fly wire from the EC pad is soldered to its adjacent module I/O pin.

In FIG. 2, the structure of the EC card is illustrated as well as its mechanical and electrical attachment to the integrated circuit module 10. The EC card has a non-conductive substrate 28 on which the printed circuit pattern is printed. In its simplest form the EC card has a conductive layer 30 which may be etched away in a pattern that will leave the desired electrical circuit connections on the top surface of the EC card.

The EC card 12 has a circuit device 32 soldered to a circuit path on the top surface of the card by solder pads 34 and 36. The card is mechanically attached to the surface 38 of the integrated circuit module 10 by an adhesive 40. Examples of adhesives that can be used are hot glues, epoxy resins or double side adhesive tape. The adhesive is preferably insulative although an insulative layer 40 is not necessary unless the top surface 38 of module 10 is conductive.

Electrical connection between the EC card 12 and the module 10 is accomplished by wire 41 being attached to EC pad 42 and I/O pin 44. Wire 41 makes electrical contact with pad 42 and is held there by solder 43. The other end of wire 41 is attached to I/O pin 44 by solder 45.

Figure 3:
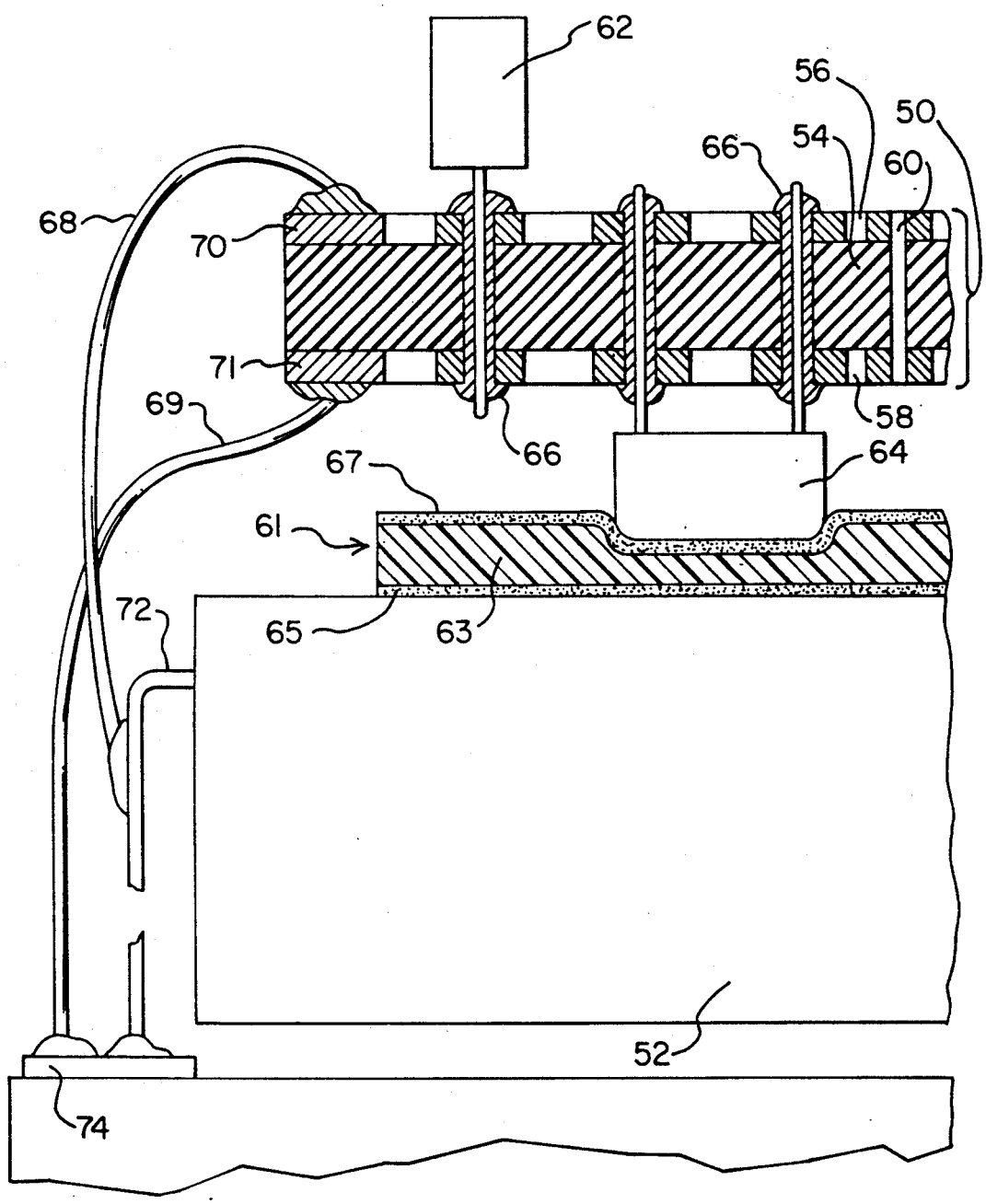
FIG. 3 shows a portion of an alternative EC card in sectional side view as mounted on top of a module. In this alternative embodiment the engineering change circuit elements are mounted on both sides of the EC card.

In another preferred embodiment of the invention shown in FIG. 3, the electrical components are mounted on both sides of the EC card and the wires from the EC card are connected to a module I/O pin and its solder pad on the main board. EC card 50 is mounted on the surface of integrated circuit module 52.

The EC circuit card has an insulative substrate 54 and two layers 56 and 58 that are connection lines or printed circuit paths. Connection lines in layer 56 may be connected to connection lines in layer 58 by vias 60. The electrical components 62 and 64 in FIG. 3 are mounted on both sides of EC card 50 and have pins that protrude through the card and are soldered to the card with solder 66.

The card is mechanically attached to top of module 52 by a double-side adhesive tape 61 that has a foam core 63. Components such as device 64 compress into the foam core tape and stick to adhesive layer 67 of the tape. The adhesive 65 o the underside of tape 61 adheres to the top of module 52. Mechanical attachment of the EC card to the module is enhanced by the soldering of the electrical connections between the card and the module.

The EC card is electrically connected to the module by a wire 68 soldered to an EC pad 70 of the card. Also in a two sided printed circuit card a connective wire 69 may be soldered to an EC pad 71 on the underside of the EC card.

Wire 68 is soldered to I/O pin 72 of the module as in FIG. 2. However, in FIG. 3, I/O pin 72 has been severed so that it no longer is electrically connected to circuits on main board 76 on which the IC module is mounted. Instead wire 69 connects a change circuit on EC card 50 to a circuit on the board 76 via pad 74.

By cutting the I/O pin 72 and connecting the fly wires from the EC card to the severed I/O pin and/or a pad on the main board 76, a number of engineering change options are available. The options include (1) inserting an EC circuit on EC card 50 between a circuit on main board 76 and an integrated circuit in module 52, (2) inserting such an EC circuit into a circuit on the main board 76, and (3) inserting such an EC circuit into a circuit in the module. Option (1) is illustrated in FIG. 3. Option (2) can be accomplished by omitting connective wire 68 in FIG. 3. Option (3) can be accomplished by omitting connective wire 69 in FIG. 3.

While a number of preferred embodiments of the invention have been shown and described, it will be appreciated by one skilled in the art, that a number of further variations or modifications may be made without departing from the spirit and scope of my invention.

What is claimed is:

1. An apparatus for correcting or modifying the function of an integrated circuit by adding electrical circuit components to the integrated circuit, said apparatus comprising:
   a circuit module for encapsulating the integrated circuit;
   a printed-circuit board, said board having lateral boundaries less than or equal to the lateral boundaries of said module;
   one or more change circuits for correcting or adding function to one or more circuits integrated into the module, each of said change circuits mounted on said board and including discrete, replaceable electrical components interconnected by printed circuits on said board;
   one surface of said board being positioned adjacent to, spaced apart from and within the peripheral boundaries of one surface of said module whereby the card does not extend beyond the boundaries of the module;

electrically conductive wires attached between the change circuits on said board and the module's integrated circuit to be corrected or modified.

2. The apparatus of claim 1 and in addition:
input/output pads of the change circuit being laid out on said board in juxtaposition with input/output pins from the module circuit being changed or modified whereby said wires have the shortest possible path.

3. The apparatus of claim 2 and in addition:
an insulating adhesive in the space between the adjacent surfaces of said board and said module for mechanically attaching said board to said module.

4. The apparatus of claim 1 wherein:
said board carries printed-circuits on both its top and bottom surfaces; and
said change circuits are mounted on either or both the top and bottom surfaces of said board.

5. The apparatus of claim 4 and in addition:
an insulative, adhesive foam in the space between the adjacent surfaces of said board and said module for mechanically attaching board to said module.

6. An apparatus for implementing engineering changes in one or more circuits electrically connected to integrated circuits whether such circuits to be changed are a part of the integrated circuits or are external to the integrated circuits, said apparatus comprising:
a primary circuit board;
a module encapsulating the integrated circuits and mounted on the primary circuit board with input-/output terminals from the integrated circuits;
change circuit means for adding electrical circuit elements to at least one circuit connected to the terminals of the module, said circuit elements comprise discrete, readily-available circuit components;
a second circuit board in addition to the primary circuit board, said second circuit board for carrying said change circuit means and including printed circuits to interconnect said circuit elements;
means for mechanically positioning said second circuit board adjacent but spaced apart from a surface of the module and positioned relative to the module such that the lateral boundaries of said second circuit board lie within the lateral boundaries of the module;
means for electrically connecting said change circuit means to the module input/output terminals connected to the circuit to be changed.

7. The apparatus of claim 6 and in addition:
means in the space between said second circuit board and the module for mechanically attaching said second circuit board to and electrically insulating said second circuit board from the adjacent surface of the module.

8. The apparatus of claim 6 wherein said means for electrically connecting comprises:
fly wires for connecting electrical signals between said change circuit means and the terminals of the circuit being changed.

9. The apparatus of claim 8 wherein:
a module input/output terminal divided with a first portion only connected to a circuit in the module and a second portion only connected to a circuit on the primary circuit board;
one of said fly wires being connected from said change circuit means to the first portion of the input/output terminal; and
another of said fly wires being connected to the second portion of the input/output terminal whereby said change circuit means is electrically inserted between a circuit on the primary circuit board and a circuit in the module.

10. The apparatus of claim 8 wherein:
a module input/output terminal divided with a first portion only connected to a circuit in the module and a second portion only connected to a circuit on the primary circuit board;
at least one of said fly wires being connected to the second portion of the input/output terminal whereby said change circuit means is electrically connected to a circuit on the primary board.

11. The apparatus of claim 8 wherein:
a module input/output terminal divided with a first portion only connected to a circuit in the module and a second portion only connected to a circuit on the primary circuit board;
at least one of said fly wires being connected to the first portion of the input/output terminal whereby said change circuit means is electrically connected to an integrated circuit in the module.

12. The apparatus of claim 6 wherein said second circuit board carries said circuit elements on both sides of aid second board.

13. The apparatus of claim 12 wherein:
the side of said second circuit board adjacent to the surface of said module carries circuit elements; and
said means for attaching comprises an insulative, adhesive foam.

* * * * *